United States Patent
Chun et al.

(10) Patent No.: US 9,377,687 B2
(45) Date of Patent: Jun. 28, 2016

(54) METHOD FOR MANUFACTURING PATTERN USING CHEMICALLY AMPLIFIED RESIST

(71) Applicant: SAMSUNG DISPLAY CO., LTD., Yongin-si, Gyeonggi-Do (KR)

(72) Inventors: Jun Chun, Yongin-si (KR); Ji-Hyun Kim, Seoul (KR); Sung-Kyun Park, Suwon-si (KR); Jeong-Min Park, Seoul (KR); Jung-Soo Lee, Seoul (KR); Jin-Ho Ju, Seoul (KR)

(73) Assignee: SAMSUNG DISPLAY CO., LTD., Yongin, Gyeonggi-do (KR)

( * ) Notice: Subject to any disclaimer, the term of this patent is extended or adjusted under 35 U.S.C. 154(b) by 29 days.

(21) Appl. No.: 14/295,463

(22) Filed: Jun. 4, 2014

(65) Prior Publication Data

US 2015/0155161 A1    Jun. 4, 2015

(30) Foreign Application Priority Data

Dec. 4, 2013  (KR) .......... 10-2013-0149824

(51) Int. Cl.
*G03F 7/26* (2006.01)
*G03F 7/039* (2006.01)
*H01L 21/3213* (2006.01)

(52) U.S. Cl.
CPC ........ *G03F 7/0392* (2013.01); *H01L 21/32139* (2013.01)

(58) Field of Classification Search
CPC ......................................................... G03F 7/26
See application file for complete search history.

(56) References Cited

U.S. PATENT DOCUMENTS

| | | |
|---|---|---|
| 6,048,672 A | 4/2000 | Cameron et al. |
| 6,174,650 B1 | 1/2001 | Endo et al. |
| 6,258,972 B1 | 7/2001 | Nakaoka et al. |
| 6,465,161 B1 | 10/2002 | Kang et al. |
| 2007/0105040 A1 | 5/2007 | Toukhy et al. |
| 2008/0233292 A1 | 9/2008 | Kusaki et al. |
| 2011/0254133 A1 | 10/2011 | Pohlers |
| 2011/0256481 A1 | 10/2011 | Pohlers |
| 2011/0269078 A1 | 11/2011 | Rathsack et al. |
| 2012/0045616 A1 | 2/2012 | Ishiji et al. |
| 2012/0196211 A1 | 8/2012 | Masunaga et al. |
| 2012/0282483 A1* | 11/2012 | Ivanov .............. C23C 8/02 428/603 |

FOREIGN PATENT DOCUMENTS

KR    2001-0017899 A    3/2001

\* cited by examiner

*Primary Examiner* — Kathleen Duda
(74) *Attorney, Agent, or Firm* — Lee & Morse, P.C.

(57) ABSTRACT

A method of manufacturing a pattern includes forming a pattern material layer on a substrate, forming a protective layer on the pattern material layer, forming a resist layer on the protective layer, selectively exposing the resist layer to light, and developing the selectively exposed resist layer.

13 Claims, 4 Drawing Sheets

METHOD FOR MANUFACTURING PATTERN USING CHEMICALLY AMPLIFIED RESIST

CROSS-REFERENCE TO RELATED APPLICATION

Korean Patent Application No. 10-2013-0149824 filed on Dec. 4, 2013, in the Korean Intellectual Property Office, and entitled: "METHOD FOR MANUFACTURING PATTERN USING CHEMICALLY AMPLIFIED RESIST," is incorporated by reference herein in its entirety.

BACKGROUND

1. Field

Embodiments relate to a method of manufacturing a pattern.

2. Description of the Related Art

Photolithography is performed to pattern parts in a manufacturing process of semiconductor device or flat panel display. Photolithography includes exposure and developing. A light-sensitive photoresist is used in the process.

SUMMARY

Embodiments are directed to a method of manufacturing a pattern including forming a pattern material layer on a substrate, forming a protective layer on the pattern material layer, forming a resist layer on the protective layer, selectively exposing the resist layer to light, and developing the selectively exposed resist layer.

The pattern material layer may include at least one metal.

The pattern material layer may include at least one of a metal layer and a metal alloy layer.

The protective layer may include a compound represented by the following Formula 1:

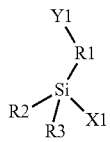

[Formula 1]

wherein Y1 is $NH_2$ or OH, X1 is a halogen or an alkoxy group, R1 is a C1 to C10 alkyl group, a phenyl group, or an alkylbenzene including a C1 to C10 alkyl group, R2 is hydrogen, a methyl group, an ethyl group, a halogen, or an alkoxy group, and R3 is hydrogen, a methyl group, an ethyl group, a halogen element, or an alkoxy group.

In Formula 1, X1 may be Cl, $OCH_3$, or $OC_2H_5$, R1 may be a linear C1 to C10 alkyl group, and at least one of R2 and R3 may be a methyl group.

A compound represented by Formula 1 may have a structural formula represented by any one of the following Formulas 3a to 3c:

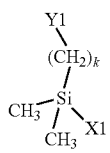

[Formula 3a]

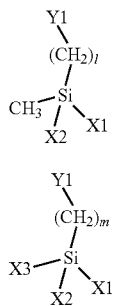

[Formula 3b]

[Formula 3c]

wherein, in Formulas 3a, 3b, and 3c, Y1 may be $NH_2$ or OH, X1 to X3 may be Cl, $OCH_3$, or $OC_2H_5$, and k, l, and m may be an integer of 1 to 10, respectively.

The protective layer may include a compound represented by the following Formula 4:

Y4-R4-S—X4    [Formula 4]

wherein Y4 may be $NH_2$ or OH, R4 may be a C1 to C10 alkyl group, a phenyl group, or an alkylbenzene including a C1 to C10 alkyl group, and X4 is any one of Cl, $OCH_3$, and $OC_2H_5$.

The method may further include hydrating the pattern material layer before forming the protective layer.

Forming the protective layer may include dipping the substrate on which the pattern material layer is formed into a protective layer-forming solution including at least one of compounds represented by the following Formulas 1 and 4:

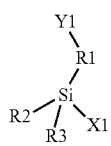

[Formula 1]

wherein Y1 may be $NH_2$ or OH, X1 may be a halogen or an alkoxy group, R1 may be a C1 to C10 alkyl group, a phenyl group, or an alkylbenzene including a C1 to C10 alkyl group, R2 may be hydrogen, a methyl group, an ethyl group, a halogen, or an alkoxy group, and R3 may be hydrogen, a methyl group, an ethyl group, a halogen, or an alkoxy group, and Y4-R4-S—X4    [Formula 4]

wherein Y4 may be $NH_2$ or OH, R4 may be a C1 to C10 alkyl group, a phenyl group, or an alkylbenzene including a C1 to C10 alkyl group, and X4 may be any one of Cl, $OCH_3$, and $OC_2H_5$.

Forming the protective layer may include coating a protective layer-forming solution including at least one of compounds represented by the following Formulas 1 and 4 on the substrate where the pattern material layer is formed:

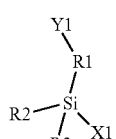

[Formula 1]

wherein Y1 may be $NH_2$ or OH, X1 may be a halogen or an alkoxy group, R1 may be a C1 to C10 alkyl group, a phenyl group, or an alkylbenzene including a C1 to C10 alkyl group, R2 may be hydrogen, a methyl group, an ethyl group, a halogen, or an alkoxy group, and R3 may be hydrogen, a methyl, an ethyl group, a halogen, or an alkoxy group, and $$Y4-R4-S-X4 \quad \text{[Formula 4]}$$

wherein Y4 may be $NH_2$ or OH, R4 may be a C1 to C10 alkyl group, a phenyl group, or an alkylbenzene including a C1 to C10 alkyl group, and X4 may be C1, $OCH_3$, or $OC_2H_5$.

The resist layer may include a chemically amplified resist.

The chemically amplified resist may include a base resin including a photoacid generator and an acid-labile group.

An amount of the photoacid generator may be 1 wt % to 30 wt % based on the total weight of the chemically amplified resist.

The protective layer may be formed at least in the light-exposed area.

The substrate may be a substrate of a display device.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
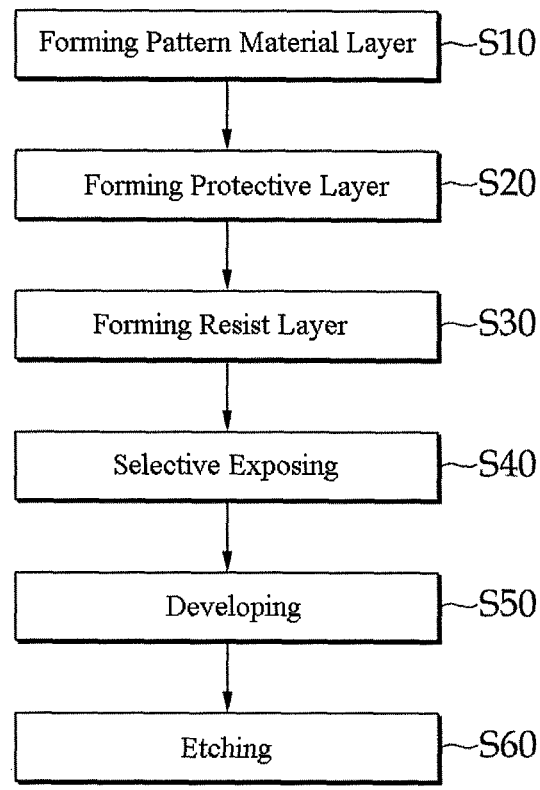
FIG. 1 is a flow chart illustrating a method for manufacturing a pattern according to an embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Like reference numerals refer to like elements throughout.

Hereinafter, according to an embodiment, a method for manufacturing a pattern will be described with reference to FIG. 1 and FIGS. 2A to 2G. FIG. 1 and FIGS. 2A to 2G illustrate stages of a process of forming a wire pattern for a display device. In other implementations the method according to embodiments may be applied to form other patterns.

A pattern material layer 200 may be formed on a substrate 100 in order to manufacture a pattern for a display device (S10).

A protective layer 300 may be formed on the pattern material layer 200 (S20) to protect the pattern material layer 200 from an excess acid ($H^+$) produced in a resist layer 400.

The resist layer 400 may be disposed on the protective layer 300 to form a pattern (S30). The resist layer 400 may be formed by using a chemically amplified resist.

A photomask 500 may be disposed on the resist layer 400 to be exposed to light, such that the resist layer 400 is selectively exposed to light (S40).

The selectively exposed resist layer 400 may be developed to form a resist pattern (S50).

The pattern material layer 200 may be etched to form a wire pattern (S60).

The substrate 100 on which a wire pattern for a display device is formed may be formed of an insulating material selected from the group of glass, quartz, ceramic, and plastic, as examples. In other implementations, the substrate 100 may be formed of a metal material such as stainless steel.

Figure 2A:
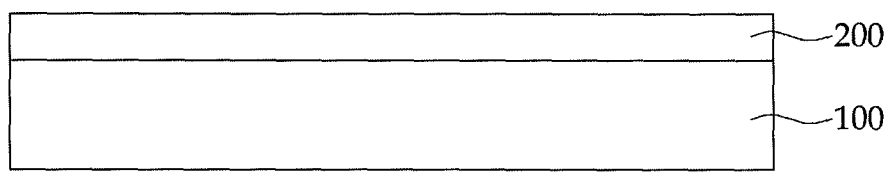
FIGS. 2A to 2G are diagrams illustrating stages of a process of forming a pattern on a substrate according to an embodiment.

The pattern material layer 200 including at least one metal may be formed on the substrate 100 (see FIG. 2A). The pattern material layer 200 may be formed of a metal or a metal alloy, e.g., one or more metals of magnesium (Mg), calcium (Ca), lithium (Li), chromium (Cr), aluminum (Al), copper (Cu), silver (Ag), gold (Au), and platinum (Pt), or alloys thereof.

For example, the pattern material layer 200 may be formed of an aluminum-based metal such as aluminum (Al) or a aluminum alloy, a silver-based metal such as silver (Ag) or a silver alloy, a copper-based metal such as copper (Cu) or a copper alloy, a molybdenum-based metal such as molybdenum (Mo) or a molybdenum alloy, chromium (Cr), tantalum (Ta), or titanium (Ti). The pattern material layer 200 may have a multilayer structure in which two or more conductive layers having different physical or chemical properties are laminated. The pattern material layer 200 may include at least one of a metal layer and a metal alloy layer.

As desired, a surface of the pattern material layer 200 may be hydrated. A hydroxyl group (OH) may improve bonds between the protective layer 300 and the pattern material layer 200. When a metal is exposed to air, the hydroxyl group (OH) may be bonded to the metal surface, and thus, separate hydration may be omitted. However, separate hydration may be performed to form a more uniform hydroxyl layer. For example, a surface of the pattern material layer 200 may be treated by at least one of water, ozone, hydrogen peroxide, and oxygen plasma, thereby forming a uniform hydroxyl group (OH) on the surface of the pattern material layer 200.

Figure 2B:
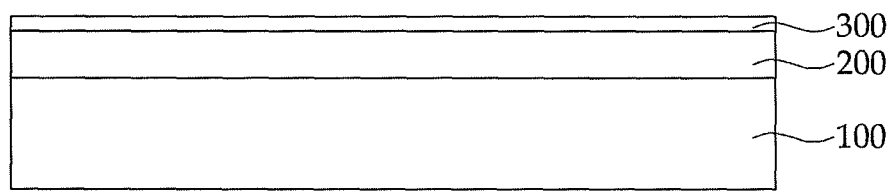

The protective layer 300 may be formed on the pattern material layer 200 (see FIG. 2B).

The protective layer 300 may prevent an acid ($H^+$) produced in the resist layer 400 from damaging the pattern material layer 200. The protective layer 300 may have protective strength to block transfer of the acid ($H^+$).

Further, the protective layer 300 may be a layer that is easily removed in processes of developing the resist layer 400 or etching the pattern material layer 200. In the case where the protective layer 300 is not easily removed, the pattern material layer 200 may not be smoothly etched. In such a case, it may be difficult to form a fine pattern. It is desirable for the protective layer 300 to be easily removable in the case of forming a fine pattern for a high-resolution display device.

The protective layer 300 may be formed to be a monomolecular layer having a basic terminal group. The basic terminal group may react with the acid ($H^+$) produced in the resist layer 400 so that the acid ($H^+$) may be consumed and may be prevented from diffusing to the pattern material layer 200. In the case where the protective layer 300 is formed to be a monomolecular layer, the protective layer 200 may be easily removed in the developing or etching process after the reaction with the acid (H⁺).

For example, the protective layer 300 may include a compound represented by the following Formula 1:

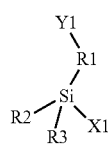

[Formula 1]

wherein Y1 is $NH_2$ or OH, X1 is a halogen or an alkoxy group, R1 is C1 to C10 alkyl group, a phenyl group, or an alkylbenzene including a C1 to C10 alkyl group, R2 is hydrogen, a methyl group, an ethyl group, a halogen, or an alkoxy group, and R3 is hydrogen, a methyl group, an ethyl group, a halogen or an alkoxy group.

In Formula 1, Y1 is a basic terminal part, and may react with the acid (H⁺) produced in the resist layer 400.

X1 may correspond to a part that bonds to the pattern material layer 200. For example, X1 may bond to a metal element contained in the pattern material layer 200. A halogen represented by X1 may be, for example, chlorine (Cl), and an alkoxy group represented by X1 may be, for example, a methoxy group ($OCH_3$) or an ethoxy group ($OC_2H_5$).

Figure 3:
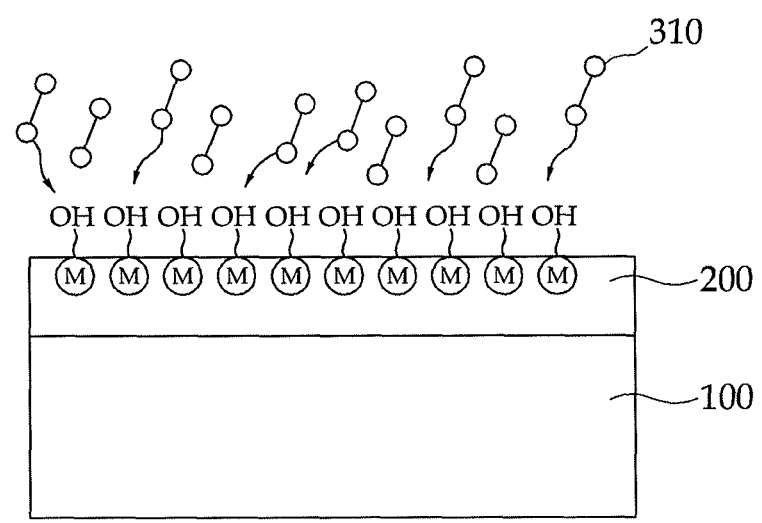
FIG. 3 is a schematic diagram illustrating a protective layer formed on a pattern material layer including a metal.

FIG. 3 is a schematic diagram illustrating the protective layer 300 being formed on the pattern material layer 200 by bonding a metal included in the pattern material layer 200 and the compound 310 (represented by the above Formula 1). X1 in Formula 1 may bond to the metal included in the pattern material layer 200 by way of the hydroxyl group (OH) in the pattern material layer 200.

R1 in Formula 1 may connect a central silicon element and a basic terminal part. R1 may assist in forming a layer. R1 may include a cyclic or linear alkyl group, or a phenyl group. In other implementations, R1 may represent a linear alkylbenzene (LAB) including a linear C1 to C10 alkyl group.

In the case where molecular weight of a compound composing the protective layer is large, or where the compound composing the protective layer contains larger linear alkyl groups or more polymerization reactors, the protective layer may become polymerized. In the event that the protective layer is polymerized, the protective layer may not be easily removable in the developing or etching process, which could cause difficulties in forming a fine pattern. Accordingly, the carbon number of R1 contained in the protective layer-forming compound of Formula 1 may be limited as mentioned above. Further, the linear alkyl group may be included only in R1.

R2 and R3 in Formula 1 may or may not participate in bonding the protective layer 300 to the pattern material layer 200. In the case where R2 and R3 participate in the bonding to the pattern material layer 200, R2 and R3 may independently represent any one of a halogen or an alkoxy group. On the other hand, in the case where R2 and R3 do not participate in the bonding to the pattern material layer 200, R2 and R3 may independently represent a short alkyl group such as a methyl group ($CH_3$) or an ethyl group ($C_2H_5$). In the case where R2 and R3 represent hydrogen (H), R2 and R3 may or may not react with the pattern material layer 200.

If R2 and R3 were to be long in length or have reactivity, R2 and R3 could react with adjacent molecules to be polymerized. In this case, the protective layer could also be polymerized, in which case, the protective layer would not be easily removable in the developing or etching process. Accordingly, R2 and R3 may be limited to the selections described above.

An example of the compound represented by Formula 1 may include a compound in which X1 is Cl, $OCH_3$, or $OC_2H_5$, R1 is a linear C1 to C10 alkyl group, and at least one of R2 and R3 is a methyl group. The compound represented by Formula 1 may include, for example, a compound represented by the following Formula 2:

 [Formula 2]

wherein X is Cl, $OCH_3$, or $OC_2H_5$, n is an integer of 1 to 10, and a is an integer of 1 to 3.

The compound represented by Formula 1 may have, for example, a structural formula represented by any one of the following Formulas 3a to 3c:

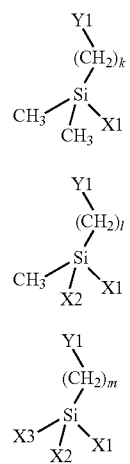

wherein Y1 is $NH_2$ or OH, X1 to X3 may be identical to or different from one another, and are Cl, $OCH_3$, or $OC_2H_5$, and k, l, and m are integers of 1 to 10.

The protective layer 300 may include sulfur (S). For example, the protective layer 300 may include a compound represented by the following Formula 4:

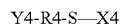 [Formula 4]

wherein Y4 represents $NH_2$ or OH, R4 represents C1 to C10 alkyl group, a phenyl group, or an alkylbenzene including a C1 to C10 alkyl group, and X4 represents Cl, $OCH_3$, or $OC_2H_5$.

The sulfur-based compound represented by Formula 4 may be usefully applied when the pattern material layer 200 includes elements such as copper (Cu), silver (Ag), platinum (Pt), or gold (Au).

The protective layer 300 may be coated by using a method of dipping, spraying, printing, or the like. For example, a protective-layer forming solution containing at least one of the compounds represented by Formulas 1 and 4, which are protective-layer forming compounds, may be jetted or printed onto the pattern material layer 200, thereby coating the pattern material layer 200 with the protective layer 300.

In other implementations, the substrate 100 on which the pattern material layer 200 is formed may be dipped into a protective-layer forming solution such that the protective layer 300 is formed on the pattern material layer 200. In this case, the protective-layer forming solution may be a dipping solution.

At least one of the compounds represented by Formulas 1 and 4 may be dissolved in a low polarity solvent at a concentration of $1.0 \times 10^{-2}$ mol/L to 1.0 mol/L in order to make a dipping solution. The substrate 100 on which the pattern material layer 200 is formed may be dipped into the dipping solution. While the dipping is performed, the compound represented by Formula 1 or 4, which is a protective layer-forming compound, may be bonded to the pattern material layer 200. In the case where the protective layer-forming compound includes a halogen such as chlorine (Cl), which may have a high reactivity with the pattern material layer 200, the dipping time may be reduced to about five (5) minutes. In the case where the protective layer-forming compound includes an alkoxy group as a part that is bonded to the pattern material layer 200, the dipping time may be increased such that the protective layer-forming compound fully reacts with the pattern material layer 200. In this case, the dipping time may be increased to about two (2) hours.

In FIG. 3, the protective layer may be formed on the pattern material layer 200 including a metal M. In detail, X1 or X4, which is a reactive portion of the protective layer-forming compound 310 represented by Formula 1 or 4, respectively may bonded to the metal M of the pattern material layer 200. In this case, the hydroxyl group (OH) attached to the metal M may participate in the above bonding, or may be detached from the metal M.

When the protective layer-forming compound 310 is bonded to the pattern material layer 200 on a surface of the pattern material layer 200, the protective layer 300 may be formed on the pattern material layer 200. For example, the protective layer 300 may be laminated to be a single layer by using the protective layer-forming compound. In other implementations, the protective layer 300 may be physically formed to have a multilayer structure. The multilayer laminated protective layer-forming compound may be easily removable by a cleaning process.

The protective layer 300 may be disposed on the entire surface of the pattern material layer 200, or may be selectively disposed on only a part of the pattern material layer 200. In this case, a separate pattern may be required for selective arrangement of the protective layer 300.

Figure 2C:
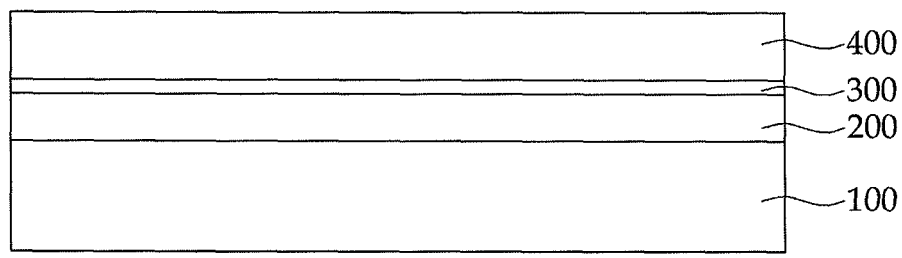

The resist layer 400 may be formed on the protective layer 300 (see FIG. 2C).

The resist layer 400 may include a chemically amplified resist (CAR). The chemically amplified resist may be a positive photoresist in which a light-exposed area is developed. The chemically amplified resist may include a base resin, a photoacid generator (PAG), a solvent, and an additive.

With respect to a chemically amplified resist used in photolithography, an amount of the photoacid generator may be associated with line edge roughness (LER) of a desired resist pattern. In the case where the resist lacks an amount of acid, or in a case where the acid concentration is not uniform in the resist, a deprotection reaction may take place only partly in the base resin included in the resist, such that the line edge roughness could result. In order to prevent the line edge roughness, a sufficient amount of acid in a uniform acid concentration may be used for the uniform deprotection reaction of the base resin.

According to an embodiment, the chemically amplified resist containing a sufficient acid may be used to reduce the line edge roughness and to form a fine pattern.

The chemically amplified resist applied to this embodiment may include a polymer having an acid-labile group as a base resin.

When light is irradiated to a positive chemically amplified resist, a photoacid generator may be decomposed by a light reaction such that an acid is produced. The base resin may be deprotected by the acid. An acid-labile group bonded to the base resin may be decomposed by the acid produced from the photoacid generator.

A mechanism in which the base resin (R—O—R') of the chemically amplified resist is deprotected by the acid (H⁺) produced from the photoacid generator may be represented by the following Equation 1:

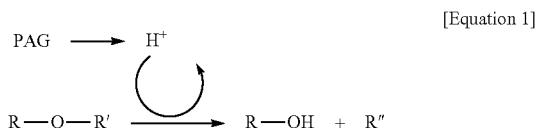

[Equation 1]

In Equation 1, R' is an acid-labile group. The resin (R—OH) deprotected by the acid produced from the photoacid generator may be in a state of being soluble in an alkaline solution so that the resist layer may be patterned.

If the chemically amplified resist contains a small amount of the photoacid generator, it may be difficult to form a pattern. On the other hand, in the case where the chemically amplified resist contains a large amount of the photoacid generator, it may be difficult to form the resist layer, and light transmission may decrease. The photoacid generator may be about 1 wt % to about 30 wt % based on the total weight of the chemically amplified resist. In consideration of usability of the deprotection reaction, the photoacid generator may be about 5 wt % to about 30 wt % based on the total weight of the chemically amplified resist.

The photoacid generator may include a triarylsulfonium salt, a diaryliodonium salt, a sulfonate, or a mixture thereof. For example, the photoacid generator may include triphenylsulfonium triflate, triphenylsulfonium antimonate, diphenyliodonium triflate, diphenyliodonium antimonate, methoxydiphenyliodonium triflate, di-t-butyldiphenyliodonium triflate, 2,6-dinitrobenzyl sulfonates, pyrogallol tris(alkylsulfonate), N-hydroxysuccinimide triflate, norbornene-dicarboximide-triflate, triphenylsulfonium nonaflate, diphenyliodonium nonaflate, methoxydiphenyliodonium nonaflate, di-t-butyldiphenyliodonium nonaflate, N-hydroxysuccinimide nonaflate, norbornene-dicarboximide-nonaflate, triphenylsulfonium perfluorobutanesulfonate, triphenylsulfonium perfluorooctanesulfonate (PFOS), diphenyliodonium PFOS, methoxydiphenyliodonium PFOS, di-t-butyldiphenyliodonium triflate, N-hydroxysuccinimide PFOS, norbornene-dicarboximide PFOS, or mixtures thereof.

The resist applied to this embodiment may include an organic base of about 0.01 wt % to about 2.0 wt % based on the total weight of the resist. As the organic base, tertiary amine compounds may be used alone or in combination with each other. For instance, the organic base may include triethylamine, triisobutylamine, triisooctylamine, triisodecylamine, diethanolamine, triethanolamine, N-alkyl-substituted pyrrolidone, N-alkyl-substituted caprolactam, N-alkyl substituted valerolactam, or mixtures thereof.

The resist may further include a surfactant in an amount of about 30 ppm to about 200 ppm.

Figure 2D:
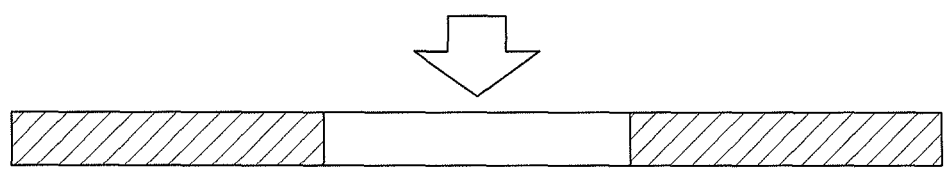
Figure 2D:
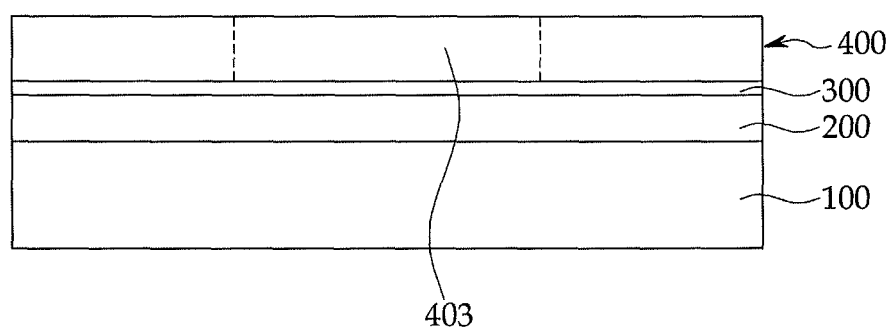

A photomask 500 may be disposed on the resist layer 400, and then light may be irradiated to the photomask 500 such that the resist layer 400 is selectively exposed to light (see FIG. 2D).

A suitable one light source selected from the group of an ArF excimer laser (193 nm), an F2 excimer laser (157 nm), and an extreme ultraviolet (EUV) laser (13.5 nm), as examples, may be used as a light source. In other implementations, lasers producing light within a far ultraviolet (FUV) light or visible light region may be used.

An acid ($H^+$) may be produced from the photoacid generator in a light-exposed area 403 of the resist layer 400 by the exposure.

The resist layer 400 may contain a sufficient photoacid generator. Accordingly, the base resin of the light-exposed area may be fully deprotected without a separate post exposure bake. According to an embodiment, photolithography may be performed by using the chemically amplified resist without the post exposure bake.

Figure 4A:
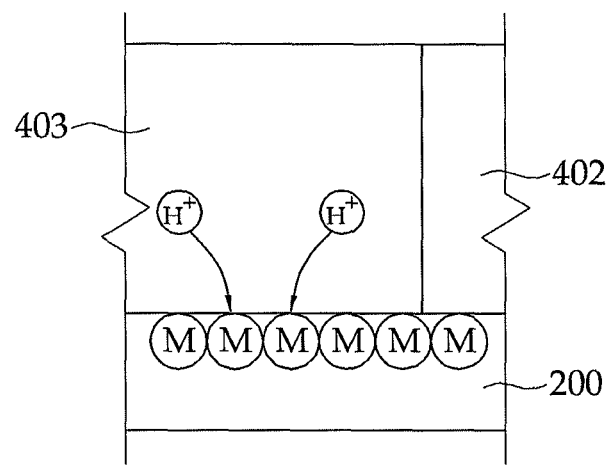
FIG. 4A is a schematic diagram illustrating a reaction between an acid ($H^+$) and a metal of a pattern material layer in the absence of a protective layer.

A relatively large amount of acid may be produced in the light-exposed area by the exposure. As illustrated in FIG. 4A, in the absence of the protective layer 300, the large amount of acid produced in the light-exposed area 403 of the resist layer 400 may react with a metal element of the pattern material layer 200.

Figure 4B:
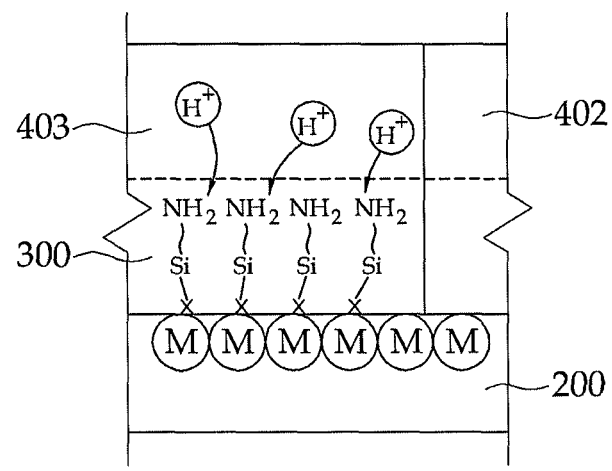
FIG. 4B is a schematic diagram illustrating a reaction between an acid ($H^+$) and a protective layer when the protective layer is disposed on a metal layer.

According to an embodiment, the protective layer 300 may be disposed on the pattern material layer 200 as illustrated in FIG. 4B. As a result, the acid produced in the light-exposed area 403 of the resist layer 400 may be prevented from reacting directly with metal elements of the pattern material layer 200.

Figure 2E:
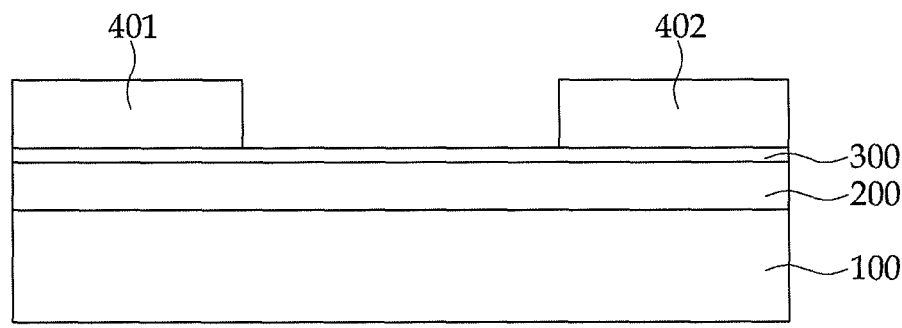

Next, the resist layer 400 may be developed (see FIG. 2E).

The deprotected base resin of the light-exposed area 403 may be removed by a developer. An alkaline solution, which is conventionally used to develop the resist, may be also used as the developing solution. Further, a solution of 10 wt % or less, e.g., a tetramethylammonium hydroxide solution of about 2.38 wt %, may be used as the alkaline solution.

In detail, the resist layer 400 may contact the alkaline solution that is a developing solution so that the light-exposed area 403 of the resist layer 400 may be dissolved to be removed, and then resist patterns 401 and 402 including a non-exposed area of the resist layer 400 remain on the substrate 100 (see FIG. 2E).

Figure 2F:
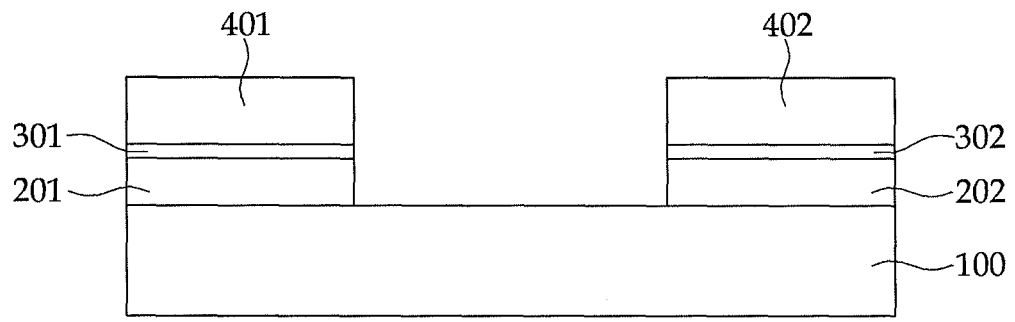

The developing solution may be cleaned, and thereafter the pattern material layer 200 may be selectively etched to form wire patterns 201 and 202 (see FIG. 2F). In this case, the protective layer 300 remaining on the pattern material layer 200 may also be etched such that protective layer patterns 301 and 302 may be also formed.

Figure 2G:

Next, the resist patterns 401 and 402 and the protective layer patterns 301 and 302 may be removed such that the wire patterns 201 and 202 may be formed on the substrate 100 (see FIG. 2G).

A method for removing the resist may also be applied to the removal of the resist patterns 401 and 402 and the protective layer patterns 301 and 302. For example, plasma may be used.

The wire patterns 201 and 202 may be wires for a display device. The method of forming the patterns may be applied to a method of manufacturing a display device.

In other implementations, the wire patterns 201 and 202 may be a wire for a semiconductor, or may be an electrode of a thin film transistor. Accordingly, the method of forming the patterns may also be applied to a method of manufacturing a semiconductor or a thin film transistor.

By way of summation and review, display devices having high resolution and devices that are highly integrated have been developed in recent years. Fabrication of such devices includes forming a fine pattern. A chemically amplified resist has attracted attention as a resist for producing such a fine pattern.

The chemically amplified resist includes a base resin and a photoacid generator. A base resin of a light-exposed area is deprotected in an exposure process, and is removed in a developing process, so that a pattern is formed. The photoacid generator generates an acid during the deprotection, and the acid acts as a catalyst of the deprotection. An acid catalyst is generated from the photoacid generator by light irradiation, and the acid catalyst amplifies the deprotection of a base resin.

Activation energy for the deprotection reaction of the base resin in the resist is generally provided by heat. A post exposure bake using a baking unit is generally performed to heat a resist layer after the exposure process. However, it may be difficult to carry out a process of forming a fine pattern using a chemically amplified resist with a process system that does not include a baking unit.

Embodiments provide a method of manufacturing a pattern using a protective layer that protects a pattern material layer from a chemically amplified resist.

Embodiments provide a method of manufacturing a pattern that enables photolithography to be carried out using a chemically amplified resist even though a post exposure bake is not performed. According to embodiments, the chemically amplified resist may contain a large amount of photoacid generators in order to perform the photolithography without a post exposure baking process. When a chemically amplified resist containing a large amount of photoacid generators is used, there is a risk that a pattern material may be damaged. In the particular case where the pattern material is a metal or a metal alloy, there is a risk that significant damage may occur, and as a result it may be difficult to obtain a fine pattern.

According to embodiments, a method of manufacturing a pattern is provided in which a pattern material is protected from damage when a chemically amplified resist containing a large amount of photoacid generators is used. According to embodiments, a pattern may be formed of a pattern material that is not damaged by forming the protective layer on the pattern material layer even though the chemically amplified resist containing many photoacid generators is used. As a result, photolithography using the chemically amplified resist may be performed without a post exposure bake process, and a fine pattern may be easily obtained.

Example embodiments have been disclosed herein, and although specific terms are employed, they are used and are to be interpreted in a generic and descriptive sense only and not for purpose of limitation. Accordingly, it will be understood by those of skill in the art that various changes in form and details may be made without departing from the spirit and scope thereof as set forth in the following claims.

What is claimed is:

1. A method of manufacturing a pattern, the method comprising:
   forming a pattern material layer on a substrate;
   forming a protective layer on the pattern material layer;
   forming a resist layer on the protective layer;
   selectively exposing the resist layer to light; and
   developing the selectively exposed resist layer, wherein:
   the resist layer includes a chemically amplified resist, the chemically amplified resist including a photoacid generator and a base resin including an acid-labile group, and
   the protective layer includes a basic terminal group that is reactive with an acid ($H^+$) produced in the resist layer.

2. The method as claimed in claim 1, wherein the pattern material layer includes at least one metal.

3. The method as claimed in claim 1, wherein the pattern material layer includes at least one of a metal layer and a metal alloy layer.

4. The method as claimed in claim 1, wherein forming the protective layer includes applying a compound represented by the following Formula 1:

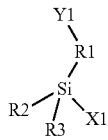
[Formula 1]

wherein:
Y1 is NH$_2$ or OH,
X1 is a halogen or an alkoxy group,
R1 is a C1 to C10 alkyl group, a phenyl group, or an alkylbenzene including a C1 to C10 alkyl group,
R2 is hydrogen, a methyl group, an ethyl group, a halogen, or an alkoxy group, and
R3 is hydrogen, a methyl group, an ethyl group, a halogen element, or an alkoxy group.

5. The method as claimed in claim 4, wherein in Formula 1,
X1 is Cl, OCH$_3$, or OC$_2$H$_5$,
R1 is a linear C1 to C10 alkyl group, and
at least one of R2 and R3 is a methyl group.

6. The method as claimed in claim 4, wherein the compound represented by Formula 1 has a structural formula represented by any one of the following Formulas 3a to 3c:

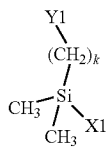
[Formula 3a]

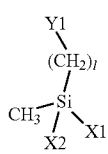
[Formula 3b]

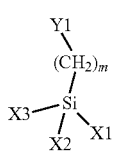
[Formula 3c]

wherein, in Formulas 3a, 3b, and 3c,
Y1 is NH$_2$ or OH,
X1 to X3 are Cl, OCH$_3$, or OC$_2$H$_5$, and k, l, and m are an integer of 1 to 10, respectively.

7. The method as claimed in claim 1, wherein forming the protective layer includes applying a compound represented by the following Formula 4:

Y4-R4-S—X4     [Formula 4]

wherein:
Y4 is NH$_2$ or OH,
R4 is a C1 to C10 alkyl group, a phenyl group, or an alkylbenzene including a C1 to C10 alkyl group, and
X4 is any one of Cl, OCH$_3$, and OC$_2$H$_5$.

8. The method as claimed in claim 1, further comprising hydrating the pattern material layer before forming the protective layer.

9. The method as claimed in claim 1, wherein forming the protective layer includes dipping the substrate on which the pattern material layer is formed into a protective layer-forming solution including at least one of compounds represented by the following Formulas 1 and 4:

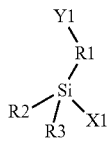
[Formula 1]

wherein:
Y1 is NH$_2$ or OH,
X1 is a halogen or an alkoxy group,
R1 is a C1 to C10 alkyl group, a phenyl group, or an alkylbenzene including a C1 to C10 alkyl group,
R2 is hydrogen, a methyl group, an ethyl group, a halogen, or an alkoxy group, and
R3 is hydrogen, a methyl group, an ethyl group, a halogen, or an alkoxy group, and Y4-R4-S—X4     [Formula 4]

wherein:
Y4 is NH$_2$ or OH,
R4 is a C1 to C10 alkyl group, a phenyl group, or an alkylbenzene including a C1 to C10 alkyl group, and
X4 is any one of Cl, OCH$_3$, and OC$_2$H$_5$.

10. The method as claimed in claim 1, wherein forming the protective layer includes coating a protective layer-forming solution including at least one of compounds represented by the following Formulas 1 and 4 on the substrate where the pattern material layer is formed:

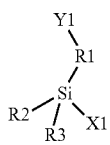
[Formula 1]

wherein:
Y1 is NH$_2$ or OH,
X1 is a halogen or an alkoxy group,
R1 is a C1 to C10 alkyl group, a phenyl group, or an alkylbenzene including a C1 to C10 alkyl group,
R2 is hydrogen, a methyl group, an ethyl group, a halogen, or an alkoxy group, and
R3 is hydrogen, a methyl, an ethyl group, a halogen, or an alkoxy group, and Y4-R4-S—X4     [Formula 4]

wherein:
Y4 is NH$_2$ or OH,
R4 is a C1 to C10 alkyl group, a phenyl group, or an alkylbenzene including a C1 to C10 alkyl group, and
X4 is Cl, OCH$_3$, or OC$_2$H$_5$.

11. The method as claimed in claim 1, wherein an amount of the photoacid generator is 1 wt % to 30 wt % based on the total weight of the chemically amplified resist.

12. The method as claimed in claim 1, wherein the protective layer is formed at least in the light-exposed area.

13. The method as claimed in claim 1, wherein the substrate is a substrate of a display device.

\* \* \* \* \*